United States Patent [19]
Wu

[11] Patent Number: 6,121,662
[45] Date of Patent: Sep. 19, 2000

[54] 3-D CMOS TRANSISTORS WITH HIGH ESD RELIABILITY

[75] Inventor: Shye-Lin Wu, Hsinchu, Taiwan

[73] Assignee: Texas Instruments - Acer Incorporated, Hsinchu, Taiwan

[21] Appl. No.: 09/062,827

[22] Filed: Apr. 20, 1998

[51] Int. Cl.[7] ..................................... H01L 29/76
[52] U.S. Cl. ........................ 257/369; 257/351; 257/69
[58] Field of Search ................................ 257/347, 350, 257/351, 67, 69, 360, 369

[56] References Cited

U.S. PATENT DOCUMENTS

| | | | |
|---|---|---|---|
| 4,754,314 | 6/1988 | Scott et al. | 257/351 |
| 5,326,991 | 7/1994 | Takasu | 257/67 |
| 5,847,419 | 12/1998 | Imai et al. | 257/351 |
| 5,869,872 | 2/1999 | Asai et al. | 257/360 |
| 5,886,385 | 3/1999 | Arisumi et al. | 257/437 |

*Primary Examiner*—Mark V. Prenty
*Attorney, Agent, or Firm*—Harness, Dickey & Pierce, P.L.C.

[57] ABSTRACT

The present invention discloses a structure for 3-D transistors with high electrostatic discharge (ESD) reliability. The 3-D transistors are fabricated on a substrate. The substrate has several recess portions and silicon islands. Several buried oxide regions are formed in the silicon islands and upper portions of the silicon islands are isolated from the substrate by the buried oxide regions. Then, a gate oxide layer is formed on the substrate. The upper portions of the silicon islands are enclosed by the gate oxide layer and the buried oxide region. A gate structure is defined on each of the recess portions and silicon islands. Two N-type source/drain regions are defined in each of the silicon islands adjacent to each of the gates on the silicon islands. Two P-type source/draid regions are fabricated in each of the recess portions adjacent to each of the gates on the recess portion. Spacers are defined on the sidewalls of the gates and abutting to the gates. Therefore, PMOS transistors are fabricated on silicon-on-insulator regions and NMOS transistors are defined on the recess portions of the substrate.

6 Claims, 3 Drawing Sheets

3-D CMOS TRANSISTORS WITH HIGH ESD RELIABILITY

FIELD OF THE INVENTION

The present invention relates to a structure of deep sub-micron SOI CMOS, and more specifically, to a structure of SOI PMOS devices on the silicon islands and bulk NMOS buffers on the substrate.

BACKGROUND OF THE INVENTION

To fabricate devices in thin silicon layer on a silicon substrate has been undertaken in recent years. The technique for building the silicon layer on the insulating substrate is referred to as silicon on insulator (SOI). A complementary metal oxide semiconductor (CMOS) device in the silicon on insulator has good device's characteristics, for example, high speed and low power. In IEDM Tech. Dig., on page 129 (1996), S. Maeda et al. reported that a deep sub-micron SOI circuit is manufactured by using field shield isolation technology. The paper is entitled "Suppression of Delay Time Instability on Frequency using Field Shield Isolation Technology for Deep Sub-Micron SOI Circuits". The authors were successful in suppressing delay time instability depending on frequency using field shielding isolation technology for deep sub-micron SOI circuits and preventing the instability over a wide input frequency range. The method of the paper offered a stable circuit operation compatible with bulk circuits by using field shielding isolation technology while keeping SOI benefits. In this paper, separation by implanted oxygen (SIMOX) was used to form a thin silicon layer on an insulator (SOI) and a MOS device was constructed on the SOI without any area penalties in the gate array. The gate layer of the MOS device has a thickness of about 70 angstroms, a SOI layer of the device has a thickness about 1000 angstroms and a buried oxide layer has a thickness of about 4000 angstroms in this paper.

The SOI CMOS transistors have a better latch-up immunity, a better short channel behavior, a process-simplification advantage and a higher device speed than the bulk CMOS transistors. The SOI CMOS transistors are usually fabricated for radio-frequency application. Babcock demonstrated a TFSOI BiCMOS device in IEDM Tech. Dig., page 133 (1996). The title of the paper is "Low-Frequency Noise Dependence of TFSOI BiCMOS for Low Power RF Mixed-Mode Application". Babcock proposed a TFSOI BiCMOS devices designed for low power RF mixed-mode application. Separation-byimplantation-of-oxygen (SIMOX) material with 0.1 micrometers silicon thickness and a 0.4 micrometer buried oxide are used for the process. The technology is based on a fully manufacturable TFSOI 0.5 micrometers LDD CMOS and lateral bipolar process which consists of poly-buffered-LOCOS isolation, 105 angstroms gate oxide, self-aligned silicided contacts, and 2-layer metallization.

However, the electrostatic shielding discharge (ESD) voltage of SOI CMOS output buffers is smaller than the ESD voltage of bulk NMOS buffers. Chan tried to realize the ESD voltage of SOI CMOS output buffers and bulk NMOS buffers, as reference to IEEE Trans. Electron Devices, vol. ED-42, page 1816 (1995). The title of the paper is "ESD Reliability and Protection Schemes in SOI CMOS Output Buffers". Chan pointed to the result that ESD voltage sustained by the bulk SOI CMOS buffers is only about half the voltage sustained by the bulk NMOS buffers. The authors tried to fabricate ESD protection circuit on the SOI substrate in order to enhance ESD reliability. The conclusion of the paper was that most of the method developed in bulk technology to improve ESD performance is not effective as well in SOI circuits. Chan proposed an alternative process of the through oxide ESD protection scheme. The cross-sectional view of SOI MOS and bulk MOS was demonstrated in FIG. 1 of that paper according to the paper as a finger structure to achieve a more uniform current density. The silicon film thickness and the buried oxide thickness of the devices as were mentioned above are 1630 and 1134 angstroms, respectively.

SUMMARY OF THE INVENTION

A structure for three-dimension (3-D) CMOS transistors on a substrate is disclosed in the present invention.

The structure of 3-D CMOS transistors comprises: The substrate having a plurality of recess portions and a plurality of silicon islands; a plurality of buried oxide regions formed in the plurality of silicon islands to isolate upper portions of the plurality of silicon islands from the substrate; a gate oxide layer formed on the substrate and the silicon islands, wherein the upper portions of the plurality of silicon islands enclosed by the gate oxide layer and the plurality of buried oxide regions; a plurality of gates defined on the gate oxide layer on the plurality of recess portions of the substrate, and on the gate oxide layer on the plurality of silicon islands; a pair of N-type source/drain regions formed in the substrate adjacent to each of the plurality of gates on the plurality of recess portions to form a plurality of NMOS bulk transistors for electrostatic discharge (ESD) protective devices; a pair of P-type source/drain regions formed in the plurality of silicon islands adjacent each of the plurality of gate on the plurality of recess portions to form a plurality of PMOS transistors on the plurality of silicon islands; and a plurality of spacers abutting to sidewalls of the plurality of gates of the plurality of PMOS and NMOS transistors.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In the present invention, SOI PMOSFETs and bulk NMOSFET buffers are fabricated on a substrate. The SOI PMOSFETs is on silicon islands to isolate from the substrate and the bulk NMOSFET buffers are on the field oxide region after the field oxide is removed to increase the device's density. Using the bulk NMOSFET buffers, the electrostatic discharge (ESD) performance is improved.

Figure 6:
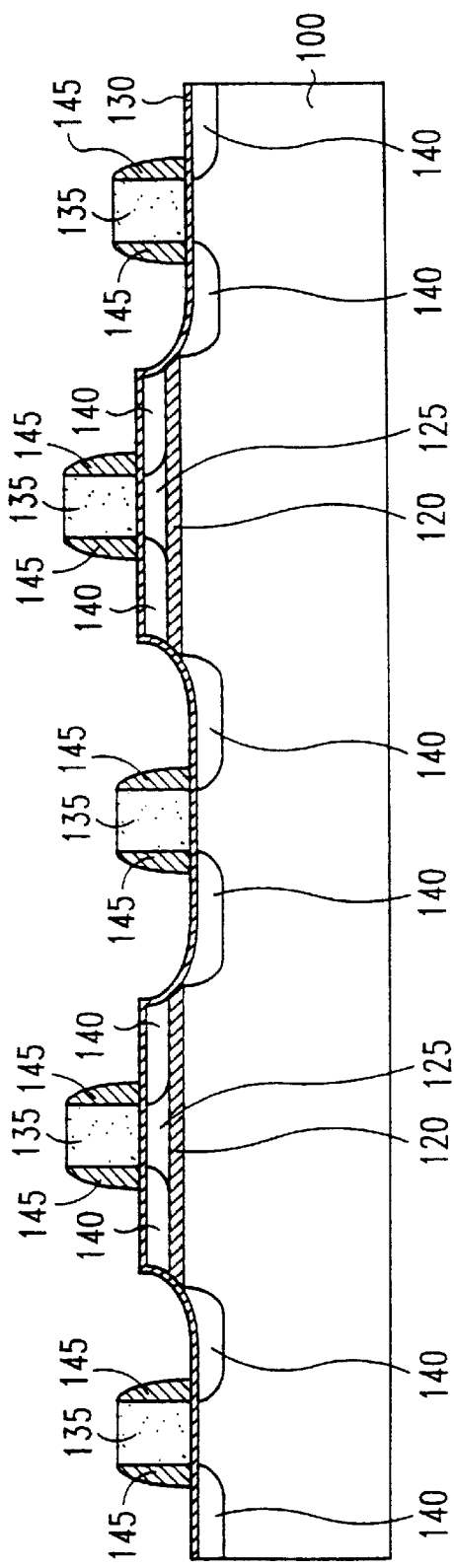
FIG. 6 shows a cross-sectional view of the substrate with SOI PMOSFETs on the silicon islands and bulk NMOSFET buffers on the substrate.

A structure for 3-D CMOS transistors on a substrate is disclosed in the present invention. Referring to FIG. 6, a cross-sectional view of a substrate 100 is shown. The substrate 100 has several recess portion 20 and several silicon islands 125, and the 3-D CMOS transistors are fabricated on the recess portions 20 and the silicon islands 125. Buried oxide layers 120 are formed in each of the silicon islands 125 and upper portion of each of the silicon islands 125 are isolated from the substrate 100 by the buried oxide layers 120. A method to form buried oxide layers 120 in the silicon islands 125 is indicated as a silicon-on-insulator technology. A gate oxide layer 130 is formed on the recess portions 20 and the silicon islands 125. On each of the recess portions 20 and each of the silicon islands 125, a gate 135 is defined. Two N-type source/drain region 140 are defined in each of the recess portions 20 adjacent to the gate on the recess portions 20 of the substrate 100. Two P-type source/drain regions 140 are formed in each of the upper portion of the silicon islands 125 adjacent to the gate on the silicon islands 125. Two spacers are defined on the sidewalls of the gates 135 and abutting to the gates 135. Therefore, a PMOS transistor is fabricated in the silicon islands 125 for a SOI MOS transistor and NMOS transistor is defined on the recess portion 20 of the substrate 100 for a ESD protective device.

Figure 1:
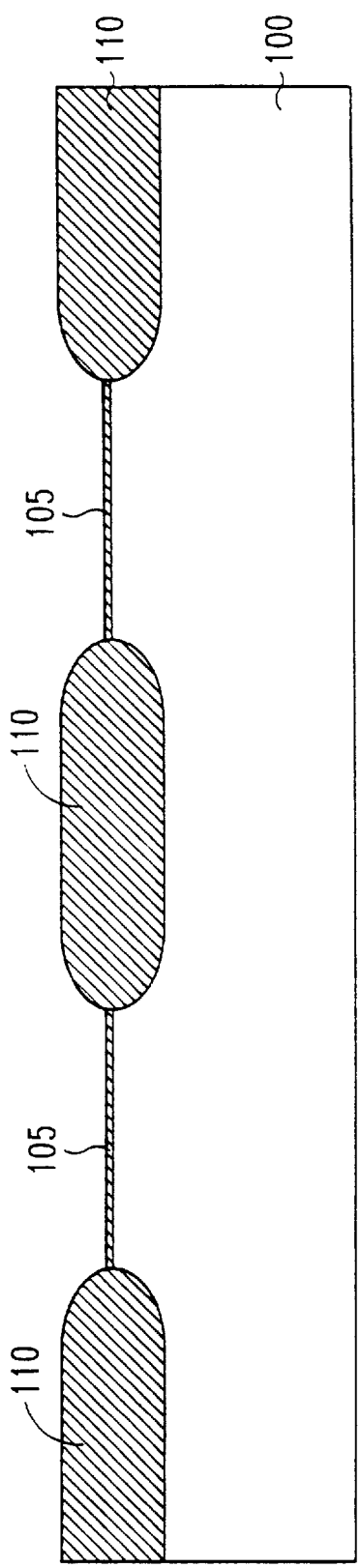
FIGS. 1 shows a cross-sectional view of a substrate with a field oxide region and a pad oxide layer on the substrate.

Referring to FIG. 1, a single crystal P-type substrate 100 with a <100>crystallographic orientation is used for the preferred embodiment. A pad oxide layer 105 is grown on the substrate 100 and it has a thickness between about 50 to 100 angstroms. In order to form the pad oxide layer 105 on the substrate 100, an oxygen ambient thermal processing is used with a thermal temperature above 800 centigrade. A silicon nitride pattern (not shown) is formed on the pad oxide layer 105 to define field oxide regions. After the definition of the field oxide region, a thick field oxide 110 is formed by using the thermal processing as described above. The thickness of the field oxide 110 is between about 3000 to 10000 angstroms. The silicon nitride pattern is then removed using hot $H_3PO_4$ solution.

Figure 2:
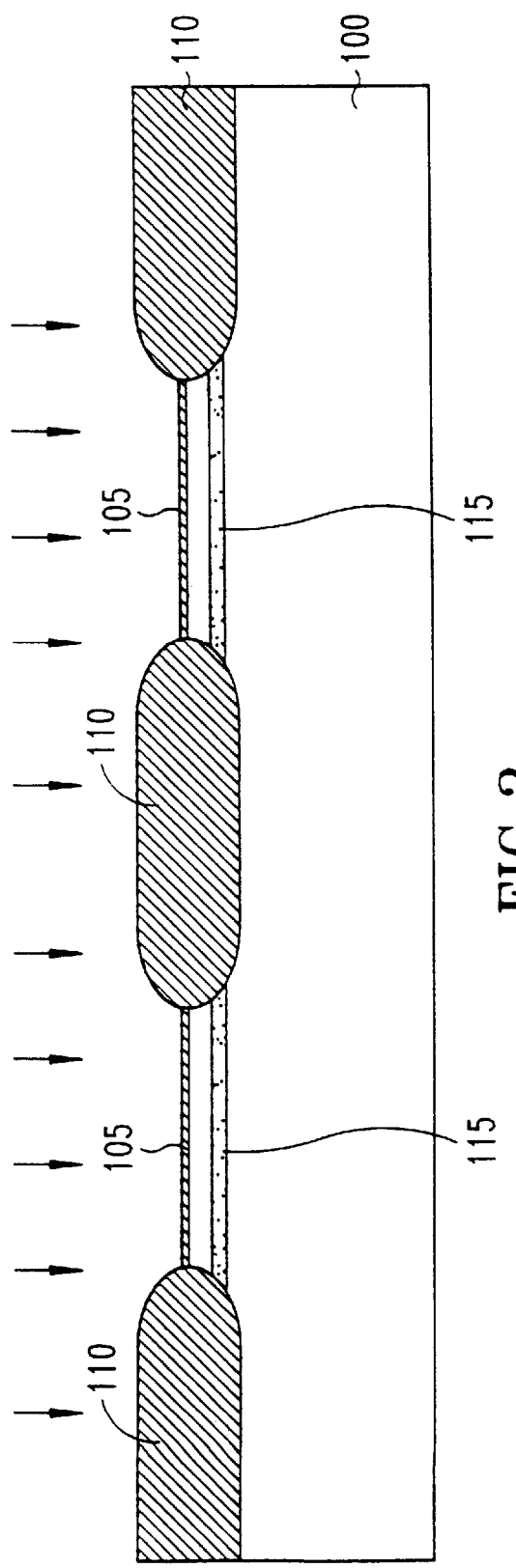
FIG. 2 shows the formation of oxygen amorphized region below the pad oxide layer.

Turning to FIG. 2, a high-energy and high-dose oxygen ion implantation is achieved to form an oxygen amorphized region 115 in the substrate 100 by using field oxide 110 as a hard mask. The energy of the implantation process is between about 100 to 500 KeV and the dose is between about $5 \times 10^{16}$ to $5 \times 10^9$ ions/cm$^2$. The substrate 100 is kept near 500 degrees centigrade during the implantation so that self-annealing maintains the crystal structure of the substrate 100. Formation of the oxygen amorphized region 115 causes the expansion of the buried layer and results to a slight swelling of the surface of the substrate 100. The implanting process related to VLSI Technology, edited by S. Sze, 1998, Chapter 8, page 366 to 369.

Figure 3:
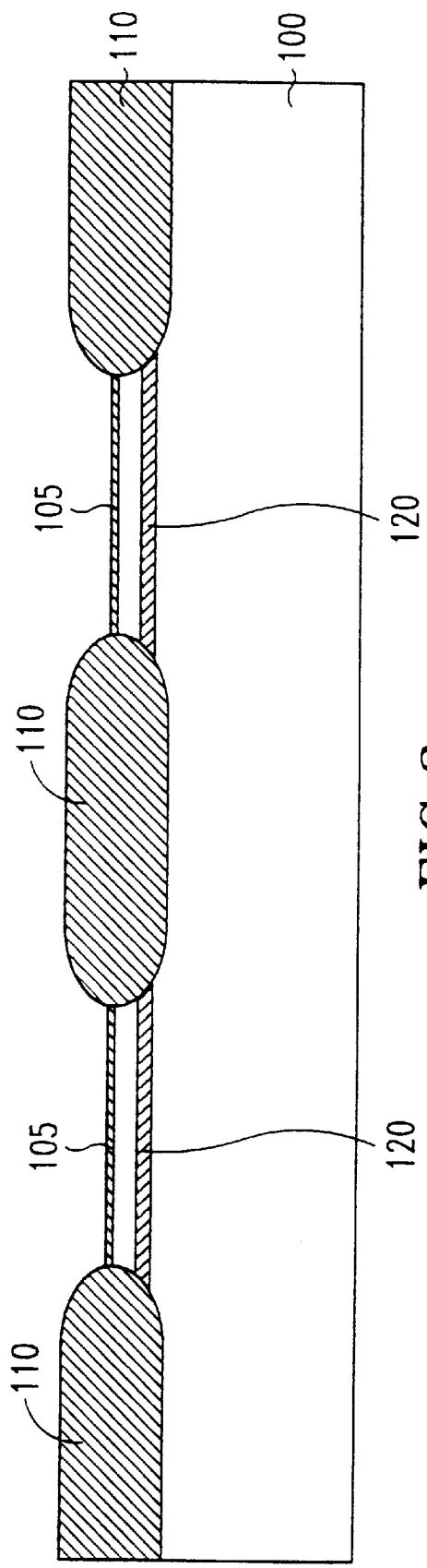
FIG. 3 shows the formation of localized Si islands on the oxygen implant-induced oxide regions.

Referring to FIG. 3, a high-temperature annealing is performed in a $N_2$ or $N_2/O_2$ ambient to convert the oxygen amorphized region 115 into an oxygen implant-induced oxide region 120. The annealing process is achieved at between about 1050 to 1350 degrees centigrade. After the high-temperature annealing, localized Si islands are formed on the oxygen implant-induced oxide region 120 to isolate from the substrate 100. In this case, the implant-induced oxide region 120 is served as a buried oxide layer and it has a thickness between about 300 to 3000 angstroms.

The implanted oxygen profile differs from that predicted by a simple linear theory because of sputtering, swelling and oxide formation. Some experiments have been undertaken to realize the implanted profile saturated when the oxygen concentration reaches that of an oxide, and the additional oxygen ions of the oxygen amorphized region diffuse to the moving silicon-oxide boundaries. The profile of the buried oxide region is changed to a flat-topped distribution after the hightemperature annealing process is done.

After the implantation, the surface layer is still a single crystal containing a substantial amount of oxygen and much damage. Annealing recovers much of the damage near the surface and causes only local diffusion of oxygen to the buried layer. Because of the high-temperature annealing, a high-quality surface film containing little oxygen is formed with less than 109 threading dislocations per square centimeter.

Figure 4:
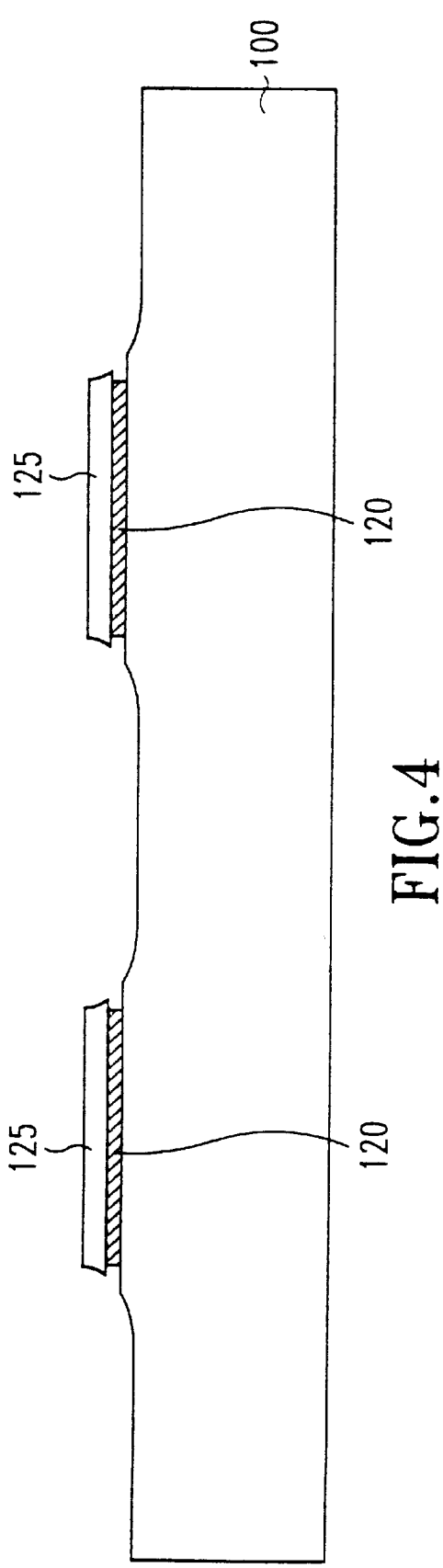
FIG. 4 shows the removing of the field oxide and the pad oxide layer to form silicon islands on the oxygen implant-induced oxide region.

Turning to FIG. 4, a wet etching process with buffer oxide etching (BOE) solution or diluted HF solution as an oxide etcher is implemented to remove the pad oxide layer 105 and the field oxide region 110. The silicon islands 125 are formed and stand on the oxygen implant-induced oxide region 120. The thickness of the silicon islands 125 is related to the depth between the oxygen implant-induced oxide 120 and the surface of the substrate 100. That is, the energy and dosage of the implantation for forming the oxygen implant-induced oxide region 120 determined the thickness of the silicon islands 125. In a preferred embodiment, the silicon islands 125 has a thickness between about 300 to 3000 angstroms.

Figure 5:
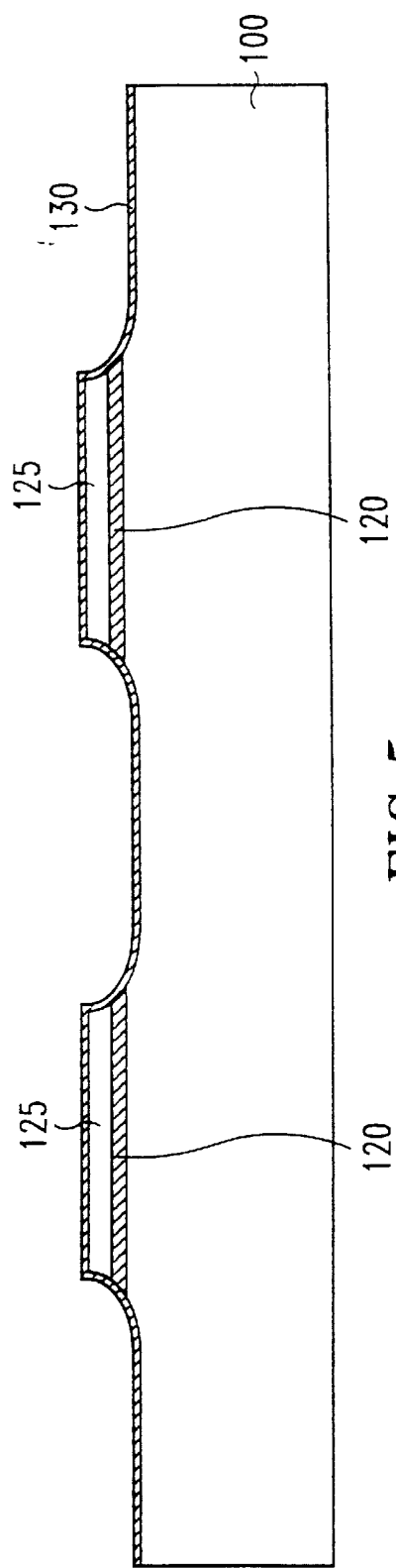
FIG. 5 shows a cross-sectional view of the substrate with the sealed Si islands by regrowing a thin gate oxide.

Turning to FIG. 5, a thermal oxidation in an $N_2$ or NO ambient is performed to regrow a thin gate oxide layer 130 and the gate oxide layer 130 seals the silicon islands 125. In this case, the processing temperature of the thermal oxidation is between about 800 to 1000 centigrade and the thin gate oxide layer 130 has a thickness between about 20 to 200 angstroms.

As is illustrated in FIG. 6, PMOSFETs are fabricated on the gate oxide layer 130 on the silicon islands 125 and NMOSFETs are manufactured on the gate oxide layer 130 on the substrate 100. The gate structure 135 of the device is defined onto the gate oxide layer 130 on the substrate 100 and the silicon islands 125, and is formed of polysilicon material. In a preferred embodiment, the gate structure 135 has a thickness between about 500 to 3000 angstroms. The source/drain regions of the PMOS and the NMOS devices are fabricated in the silicon islands 125 and the substrate 100, respectively. Then, a silicon oxide layer is deposited onto the substrate 100 and it is etched back to form the spacers 145 of the gate structure 135.

There are several advantages in the present invention. The first advantage is that the device's density could be significant increase by using field oxide region for bulk NMOS transistors. The second advantage is that the ESD reliability could be improved by using bulk NMOS buffers as a protective circuit. The last advantage is that the recipe of the present invention is manufacturable.

While the preferred embodiment of the invention has been illustrated and described, it will be appreciated that various changes can be made therein without departing from the spirit and scope of the invention.

What is claimed is:

1. A structure of 3-D CMOS transistors on a substrate, comprising:

said substrate having a plurality of recess portions and a plurality of silicon islands;

a plurality of buried oxide regions formed in said plurality of silicon islands to isolate upper portions of said plurality of silicon islands from said substrate;

a gate oxide layer formed on said substrate and said silicon islands, wherein said upper portions of said plurality of silicon islands enclosed by said gate oxide layer and said plurality of buried oxide regions;

a plurality of gates defined on said gate oxide layer on said plurality of recess portions of said substrate, and on said gate oxide layer on said plurality of silicon islands;

a pair of N-type source/drain regions formed in said substrate adjacent to each of said plurality of gates on said plurality of recess portions to form a plurality of NMOS bulk transistors for electrostatic discharge (ESD) protective devices;

a pair of P-type source/drain regions formed in said plurality of silicon islands adjacent each of said plurality of gate on said plurality of—recess portions—silicon islands to form a plurality of PMOS transistors on said plurality of silicon islands; and a plurality of spacers abutting to sidewalls of said plurality of gates of said plurality of PMOS and NMOS transistors.

2. The structure of claim 1, wherein said plurality of buried oxide layer have a thickness between about 300 to 3000 angstroms.

3. The structure of claim 1, wherein said gate oxide layer has a thickness between about 20 to 200 angstroms.

4. The structure of claim 1, wherein said plurality of silicon island have a thickness between about 300 to 3000 angstroms.

5. The structure of claim 1, wherein said plurality of gates have a thickness between about 500 to 3000 angstroms.

6. The structure of claim 1, wherein said plurality of gates are formed of polysilicon material.

\* \* \* \* \*